(12) United States Patent (10) Patent No.: US 7,109,798 B2
Darabi (45) Date of Patent: Sep. 19, 2006

(54) METHOD AND SYSTEM FOR COMMON MODE FEEDBACK CIRCUITRY FOR RF BUFFERS

(75) Inventor: Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 69 days.

(21) Appl. No.: 10/977,464

(22) Filed: Oct. 29, 2004

(65) Prior Publication Data

US 2006/0091954 A1 May 4, 2006

(51) Int. Cl.
*H03F 3/45* (2006.01)
(52) U.S. Cl. ...................................... 330/259
(58) Field of Classification Search ................. 330/259
See application file for complete search history.

(56) References Cited

U.S. PATENT DOCUMENTS 3,652,950 A * 3/1972 Hilbert ........................ 330/261
4,491,802 A * 1/1985 Uchida et al. ............... 330/260
5,187,448 A * 2/1993 Brooks et al. ............... 330/258

\* cited by examiner

*Primary Examiner*—Robert Pascal
*Assistant Examiner*—Alan Wong
(74) *Attorney, Agent, or Firm*—McAndrews, Held & Malloy, Ltd.

(57) ABSTRACT

For a high frequency buffer, a high frequency output path may be isolated from a low frequency feedback path using a common mode feedback loop. The common mode feedback loop may be utilized to adjust an output DC level. The common mode feedback loop may comprise a first differential amplifier and a first transistor. An output of the first differential amplifier may be coupled to an input of the first transistor, and the low frequency feedback path may communicate the output DC level from an output of the first transistor to a first input of the first differential amplifier. A reference voltage may be communicated to a second input of the first differential amplifier, and this reference voltage may be variable. The first differential amplifier may be adapted to compare the inputs and generate a control voltage, which may be utilized to adjust the output DC level.

22 Claims, 6 Drawing Sheets

METHOD AND SYSTEM FOR COMMON MODE FEEDBACK CIRCUITRY FOR RF BUFFERS

CROSS-REFERENCE TO RELATED APPLICATIONS/INCORPORATION BY REFERENCE

This application is related to the following applications, each of which is incorporated herein by reference in its entirety for all purposes:
U.S. patent application Ser. No. 10/976,976 filed Oct. 29, 2004;
U.S. patent application Ser. No. 10/976,977 filed Oct. 29, 2004;
U.S. patent application Ser. No. 10/977,000 filed Oct. 29, 2004;
U.S. patent application Ser. No. 10/976,575 filed Oct. 29, 2004;
U.S. patent application Ser. No. 10/977,798 filed Oct. 29, 2004;
U.S. patent application Ser. No. 10/977,005 filed Oct. 29, 2004;
U.S. patent application Ser. No. 10/977,771 filed Oct. 29, 2004;
U.S. patent application Ser. No. 10/977,868 filed Oct. 29, 2004;
U.S. patent application Ser. No. 10/976,666 filed Oct. 29, 2004;
U.S. patent application Ser. No. 10/977,631 filed Oct. 29, 2004;
U.S. patent application Ser. No. 10/976,639 filed Oct. 29, 2004;
U.S. patent application Ser. No. 10/977,210 filed Oct. 29, 2004;
U.S. patent application Ser. No. 10/977,872 filed Oct. 29, 2004;
U.S. patent application Ser. No. 10/977,869 filed Oct. 29, 2004;
U.S. patent application Ser. No. 10/977,874 filed Oct. 29, 2004; and
U.S. patent application Ser. No. 10/976,996 filed Oct. 29, 2004.

FIELD OF THE INVENTION

Certain embodiments of the invention relate to circuitry for radio frequency (RF) buffers. More specifically, certain embodiments of the invention relate to a method and system for common mode feedback circuitry for RF buffers.

BACKGROUND OF THE INVENTION

In some conventional systems for wireless communication, a radio frequency (RF) signal is converted to an intermediate frequency (IF), and then from IF to a baseband signal. Generally, the RF signal may be heterodyned, or mixed with a local oscillator frequency that results in two signals that are centered about the sum of the two frequencies and the difference of the two frequencies. Usually the lower frequency, the difference of the two frequencies, may be chosen as the IF. Therefore, a radio that may be receiving several channels, such as an AM or FM radio, may tune to a particular station by changing the local oscillator frequency such that the IF remains constant. This is superheterodyning.

In superheterodyning, the local oscillator may need to be linked to the tuner because they both may need to vary with the carrier frequency. For example, if the IF is set to 40 MHz, in order to tune in a channel at 200 MHz, the local oscillator must be set to a frequency that will heterodyne the 200 MHz to the desired IF of 40 MHz. Therefore, the local oscillator must be set to 160 MHz, or alternatively to 240 MHz, so that the difference frequency will be exactly 40 MHz. When tuned to a different channel, for example, 210 MHz, the local oscillator must change to a frequency of 170 MHz, or 250 MHz, in order to generate an IF of 40 MHz. Accordingly, the local oscillator must be capable of varying the frequency over the same range as the tuner; in fact, they must vary the same amount. Therefore, the tuner and the local oscillator may be linked so they operate together.

There may be three main advantages to superheterodyning, depending on its application. First, the signal may be reduced from very high frequency sources where ordinary components may not work very well. Reducing the frequency may allow lower cost components to be used for a majority of the receiver circuitry. Second, the receiver and/or transmitter circuitry may be optimized and/or made more inexpensively for the IF. And third, superheterodyning may be used to improve signal isolation by arithmetic selectivity.

The ability to isolate signals, or reject unwanted ones, may be a function of the receive bandwidth. For example, a bandpass filter may be used to isolate the desired signal from adjacent signals, or other frequency sources that may interfere with the desired signal. If the performance of the bandpass filter isn't sufficient to accomplish this, the performance may be improved by superheterodyning. Frequently, the bandpass filter bandwidth may be some fraction of the received carrier frequency. For example, if the bandpass filter has a pass bandwidth of 2%, and receives the carrier at 200 MHz and a noise signal at 203 MHz, then signals within the range from 196 MHz to 204 MHz, 2% above and below the carrier frequency, may be passed. This range includes the noise signal 3 MHz above the carrier.

A superheterodyne receiver which may receive the same channel may bandpass filter the 40 MHz IF, and the bandpass filter may allow signals from 39.2 MHz to 40.8 MHz to pass. However, the noise signal, which may be 3 MHz above the desired signal may now be filtered out by the bandpass filter which may have the same characteristic of 2% pass bandwidth. The superheterodyne receiver may be said to be more selective.

However, in order to make superheterodyne receivers work, a reliable, stable source of local oscillator frequency is needed. Often, the local oscillator source may be buffered from the receiver and/or the transmitter circuitry. This may reduce unwanted noise to the local oscillator circuitry. The buffer may also serve to amplify the local oscillator signal to the receiver and or the transmitter circuitry.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention provide a method and system for common mode feedback circuitry for RF buffers. Aspects of the method may describe isolating high frequency differential output paths a low frequency feedback path for a high frequency buffer using a common mode feedback loop. A first terminal of each of two inductors may be directly connected to each other and to the low frequency feedback path. A second terminal of each of the two inductors may be directly connected to each of the high frequency differential output paths. The common mode feedback loop may be utilized to adjust an output DC level and may comprise a first differential amplifier and a first transistor. An output of the first differential amplifier may be coupled to an input of the first transistor, and the low frequency feedback path may communicate the output DC level at an output of the first transistor to a first input of the first differential amplifier. A reference voltage may be communicated to a second input of the first differential amplifier, and this reference voltage may be variable. The first differential amplifier may compare the inputs and generate a control voltage, which may be utilized to adjust the output DC level.

High frequency differential signals may be generated on the high frequency output paths by a second differential amplifier. The second differential amplifier may comprise a second transistor coupled to a third transistor. Current may be generated by a current source for the second transistor and the third transistor to use in generating the high frequency differential signals on the high frequency output paths. The current generated by the current source may be variable.

Aspects of the system may describe a high frequency buffer using a common mode feedback loop, where high frequency differential output paths may be isolated from a low frequency feedback path via two inductors, and the common mode feedback loop may be utilized to adjust an output DC level. A first terminal of each of the two inductors may be directly connected to each other and to the low frequency feedback path. A second terminal of each of the two inductors may be coupled to each of the high frequency differential output paths. A first differential amplifier and a first transistor may comprise the common mode feedback loop. An output of the first differential amplifier may be coupled to an input of the first transistor, and the low frequency feedback path may be utilized to communicate the output DC level at an output of the first transistor to a first input of the first differential amplifier. A reference voltage may be communicated to a second input of the first differential amplifier, and this reference voltage may be a variable reference voltage. The first differential amplifier may be configured to compare the inputs and generate a control voltage, which may be utilized to adjust the output DC level.

A second differential amplifier may generate high frequency differential signals on the high frequency differential output paths. A second transistor coupled to a third transistor may comprise the second differential amplifier. A current source may be adapted to generate a current, which may be utilized by the second transistor and the third transistor to generate the high frequency differential signals for the high frequency differential output paths. The current generated by the current source may be a variable current.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for common mode feedback circuitry for RF buffers. Various aspects of the invention may provide support for isolating high frequency signals from a lower frequency common mode feedback signal while providing a DC biasing voltage for the high frequency signals. One aspect of the invention may comprise a differential amplifier circuit in which the complementary inputs may be amplified, and a DC bias voltage may be inserted to the complementary output signals. With respect to signals, "differential" may be the same as "complementary."

Figure 1A:
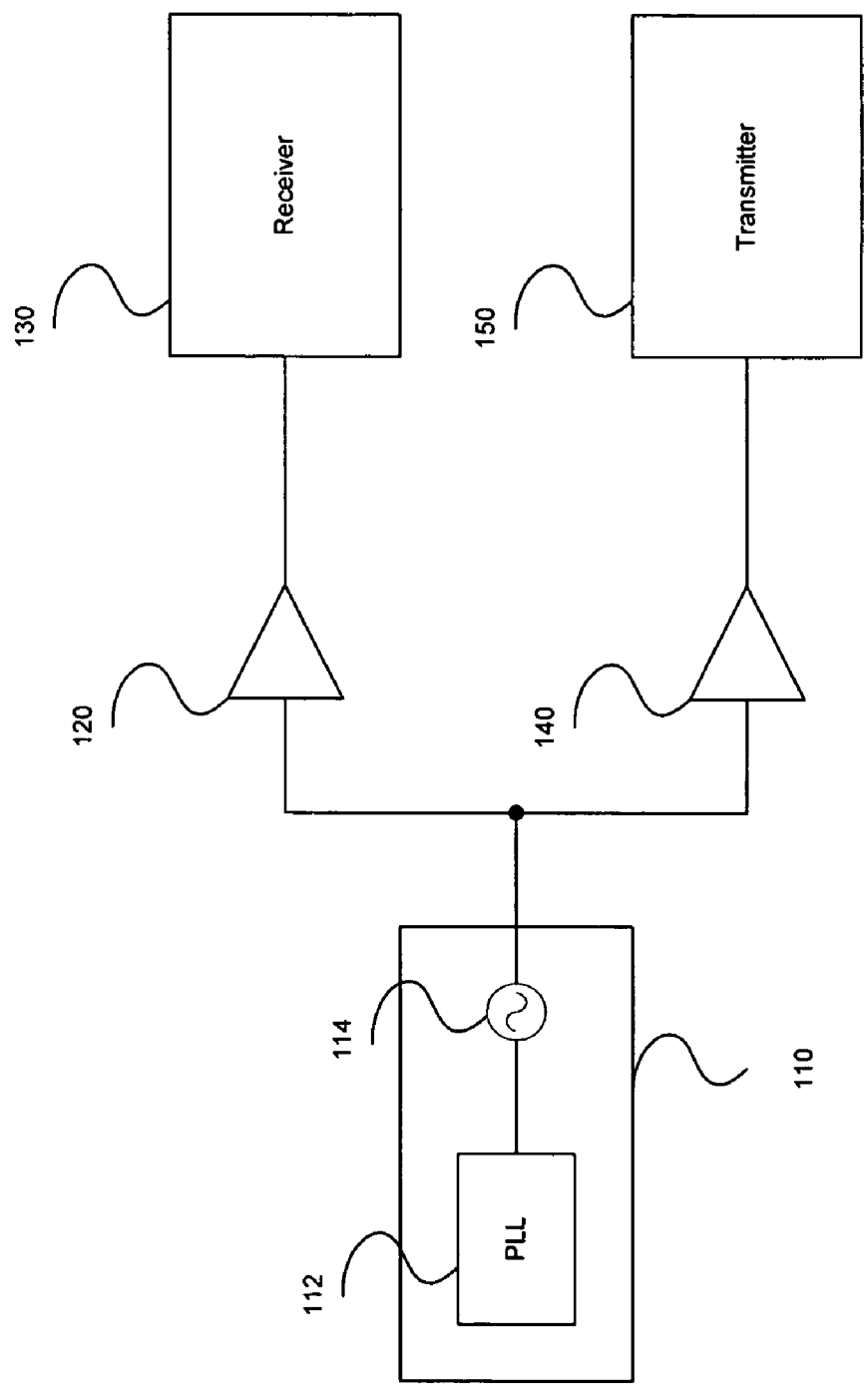
FIG. 1a is a block diagram of an exemplary system for buffering a local oscillator in a RF circuit that may be utilized in connection with an embodiment of the invention.

FIG. 1a is a block diagram of an exemplary system for buffering a local oscillator in a RF circuit that may be utilized in connection with an embodiment of the invention. Referring to FIG. 1a, there is shown a local oscillator (LO) block 110 comprising a phase-locked loop (PLL) module 112 and a voltage controlled oscillator (VCO) module 114, a plurality of RF buffer blocks 120 and 140, a RF receiver block 130, and a RF transmitter block 150.

The VCO module 114 may comprise suitable circuitry and/or logic that may be adapted to generate a waveform, for example, sinusoidal, which may be approximately the desired frequency. The PLL module 112 may be adapted to generate voltage that may force the VCO module 114 output to the desired frequency. The RF buffer blocks 120 and 140 may comprise suitable circuitry and/or logic that may be utilized to amplify the local oscillator signal from the LO block 110.

The receiver block 130 may comprise suitable circuitry, logic, and/or code that may be adapted to process RF signals and generate a baseband signal that may comprise audio, video or data signals.

The transmitter block 150 may comprise suitable circuitry, logic, and/or code that may be adapted to process the baseband signal that may comprise audio, video or data signals such that an RF signal may be generated for transmission, for example, through a wired and/or wireless media.

In operation, the LO block 110 may generate a local oscillator signal which may be amplified by the RF buffer block 120 and communicated to the receiver block 130 or amplified by the RF buffer block 140 and communicated to the transmitter block 150. The local oscillator signal from the RF buffer block 120 may be utilized by the receiver block 130 to downconvert the RF signal to the IF signal, where the IF signal may be the same frequency as the baseband signal or a frequency higher than the baseband signal. The amplified local oscillator signal from the RF buffer block 140 may be utilized by the transmitter block 150 to upconvert the IF signal, which may be at a baseband frequency or a frequency higher than the baseband signal, to the RF suitable for transmission.

Figure 1C:
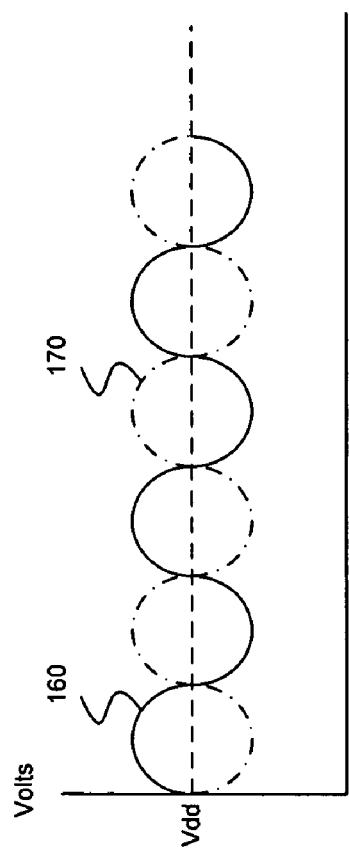
FIG. 1c is a diagram illustrating exemplary signal outputs of RF buffer illustrated in FIG. 1b that may be utilized in connection with an embodiment of the invention.
Figure 1B:
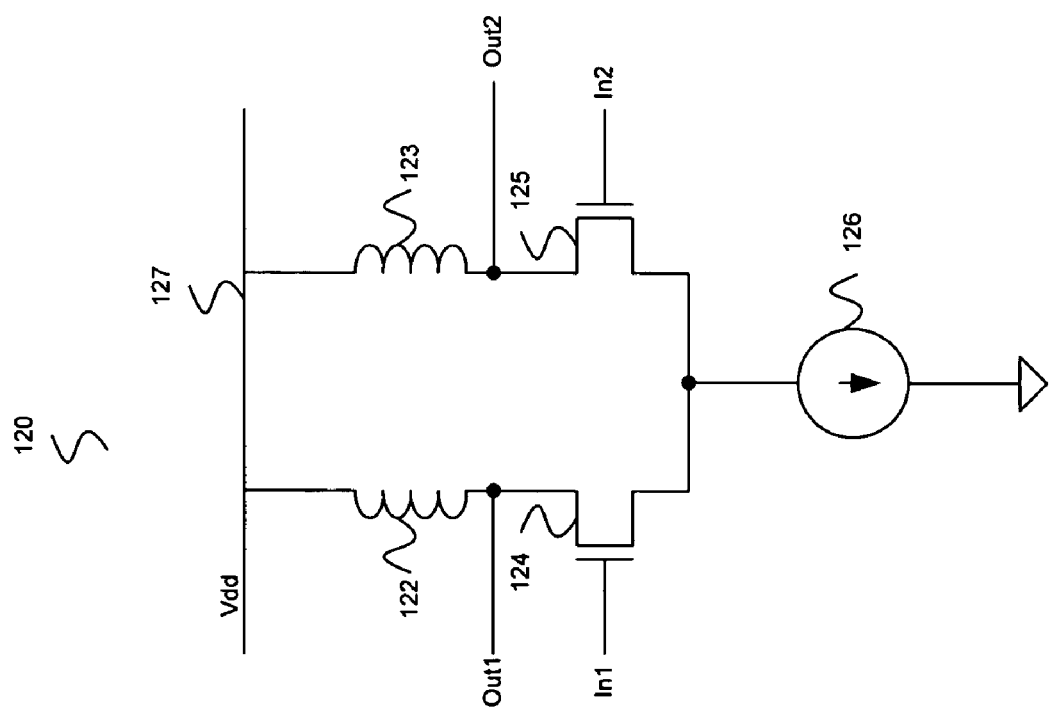
FIG. 1b is a block diagram of an exemplary system for a RF buffer that may be utilized in connection with an embodiment of the invention.

FIG. 1b is a block diagram of an exemplary system for a RF buffer that may be utilized in connection with an embodiment of the invention. Referring to FIG. 1b, there is shown a RF buffer block 120, and the RF buffer block 120 may comprise a plurality of inductors 122 and 123, a plurality of negative-channel metal oxide semiconductor (NMOS) transistors 124 and 125, and a current source 126.

With reference to FIG. 1b, one terminal of each of the inductors 122 and 123 may be coupled to a high voltage potential, or Vdd, and the other terminal of each of the inductors 122 and 123 may be coupled to a drain of each of the NMOS transistors 124 and 125, respectively. The sources of the NMOS transistors 124 and 125 may be coupled to each other, and also to a terminal of the current source 126. The other terminal of the current source 126 may be coupled to a low voltage potential, or ground. The gate of NMOS transistor 124 may receive one of the two complementary input signals In1, and the gate of the NMOS transistor 125 may receive the other of the two complementary input signals In2. The drain of the NMOS transistor 124 may provide one of the two complementary output signals Out1, and the drain of the NMOS transistor 125 may provide the other of the two complementary output signals Out2.

In operation, the complementary input signals In1 and In2 may be utilized to allow currents to flow through the NMOS transistors 124 and 125, respectively. The input signals In1 and In2 may be amplified by the NMOS transistors 124 and 125, respectively, as the output signals Out1 and Out2, respectively. The inductors 122 and 123 may resonate with capacitive loads to create tuned circuits. The tuned circuits may result in saving power when driving the capacitive loads. Due to the nature of the complementary output signals Out1 and Out2, a common node 127 may be an AC ground for those signals, and therefore, the high voltage potential Vdd may not be affected by the complementary output signals Out1 and Out2.

The high frequency signals at the drains of the NMOS transistors 124 and 125 may be biased at the Vdd voltage level. However, the circuitry that may receive the outputs of the buffer 120, for example, the receiver block 130 (FIG. 1a) and the transmitter block 150 (FIG. 1a), may not be able to utilize the high frequency signals that may be biased to the Vdd voltage level.

FIG. 1c is a diagram illustrating exemplary signal outputs of RF buffer illustrated in FIG. 1b that may be utilized in connection with an embodiment of the invention. Referring to FIG. 1c, there is shown a plurality of signals 160 and 170. Signal 160 may be a complementary output signal of the exemplary RF buffer shown in FIG. 1b, for example, Out1. Signal 170 may be the other complementary output signal of the exemplary RF buffer shown in FIG. 1b, for example, Out2. Both output signals 160 and 170 may be biased to a voltage of Vdd.

Figure 1D:
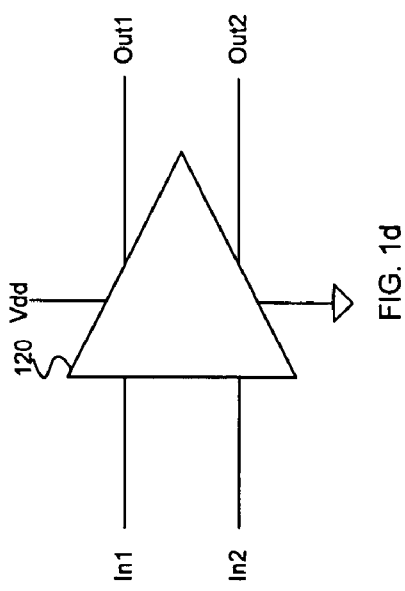
FIG. 1d is a high level block diagram of an exemplary RF buffer illustrated in FIG. 1b that may be utilized in connection with an embodiment of the invention.

FIG. 1d is a high level block diagram of an exemplary RF buffer illustrated in FIG. 1b that may be utilized in connection with an embodiment of the invention. Referring to FIG. 1d, there is shown a system level diagram of a RF buffer 120 which may include the input signals In1 and In2, the output signals Out1 and Out2, and power supply connections Vdd and ground shown by the RF buffer 120 (FIG. 1b).

Figure 1E:
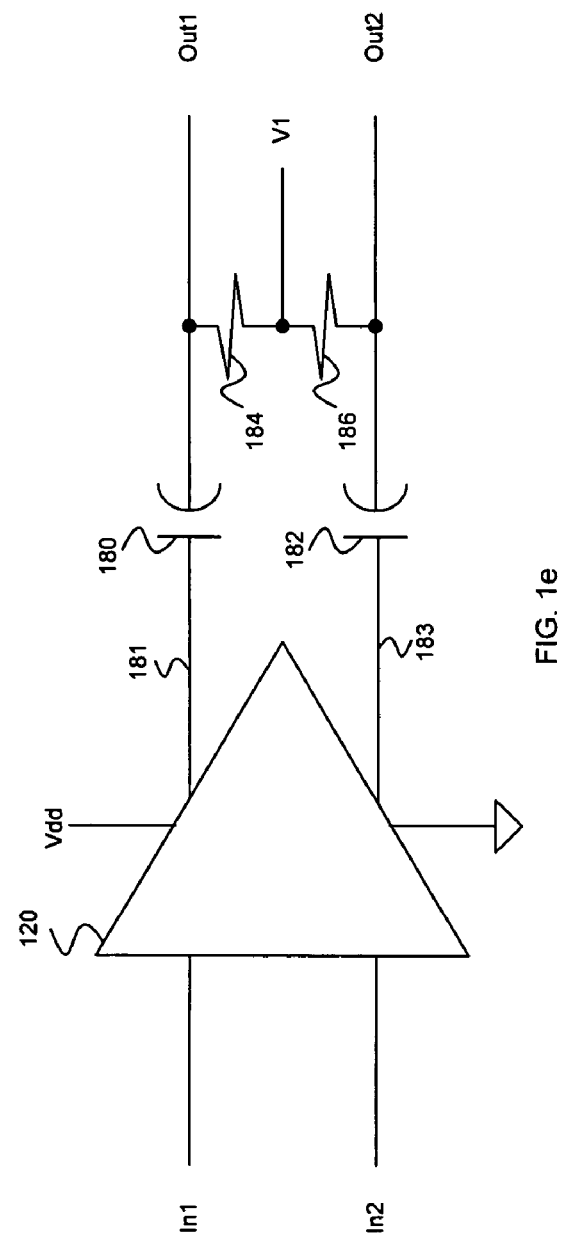
FIG. 1e is a high level block diagram of an exemplary RF buffer where a desired V1 biasing voltage is utilized, rather than Vdd biasing, via resistors and capacitors, which may be utilized in connection with an embodiment of the invention.

FIG. 1e is a high level block diagram of an exemplary RF buffer where a desired V1 biasing voltage is utilized, rather than Vdd biasing, via resistors and capacitors, which may be utilized in connection with an embodiment of the invention. Referring to FIG. 1e, there is shown a RF filter 120, capacitors 180 and 182, and resistors 184 and 186.

One complementary output 181 of the RF buffer 120 may be coupled to a terminal of the capacitor 180, and another terminal of the capacitor 180 may be coupled to a terminal of the resistor 184, and may provide the output signal Out1. The other complementary output 183 of the RF buffer 120 may similarly be coupled to the terminal of the capacitor 182, and another terminal of the capacitor 182 may be coupled to the terminal of the resistor 186, and may provide the output signal Out2. The other terminals of the resistors 184 and 186 may be coupled to each other, and also to a desired biasing DC voltage V1.

In operation, the complementary outputs 181 and 183 may communicate signals that may be biased to an undesired voltage level, for example, Vdd as in FIGS. 1b and 1c, to the capacitors 180 and 182, respectively. The passive high pass filters formed by the capacitor 180 and resistor 184, and the capacitor 182 and the resistor 186, may block the DC voltage at the complementary outputs 181 and 183, respectively. The signals Out1 and Out2 may then be biased by the V1 voltage. However, there may be some shortcomings. For example, the capacitors and resistors may require additional chip space, and may therefore be undesirable, and additionally, signal loss across the passive high pass filters may be undesirable.

Figure 1F:
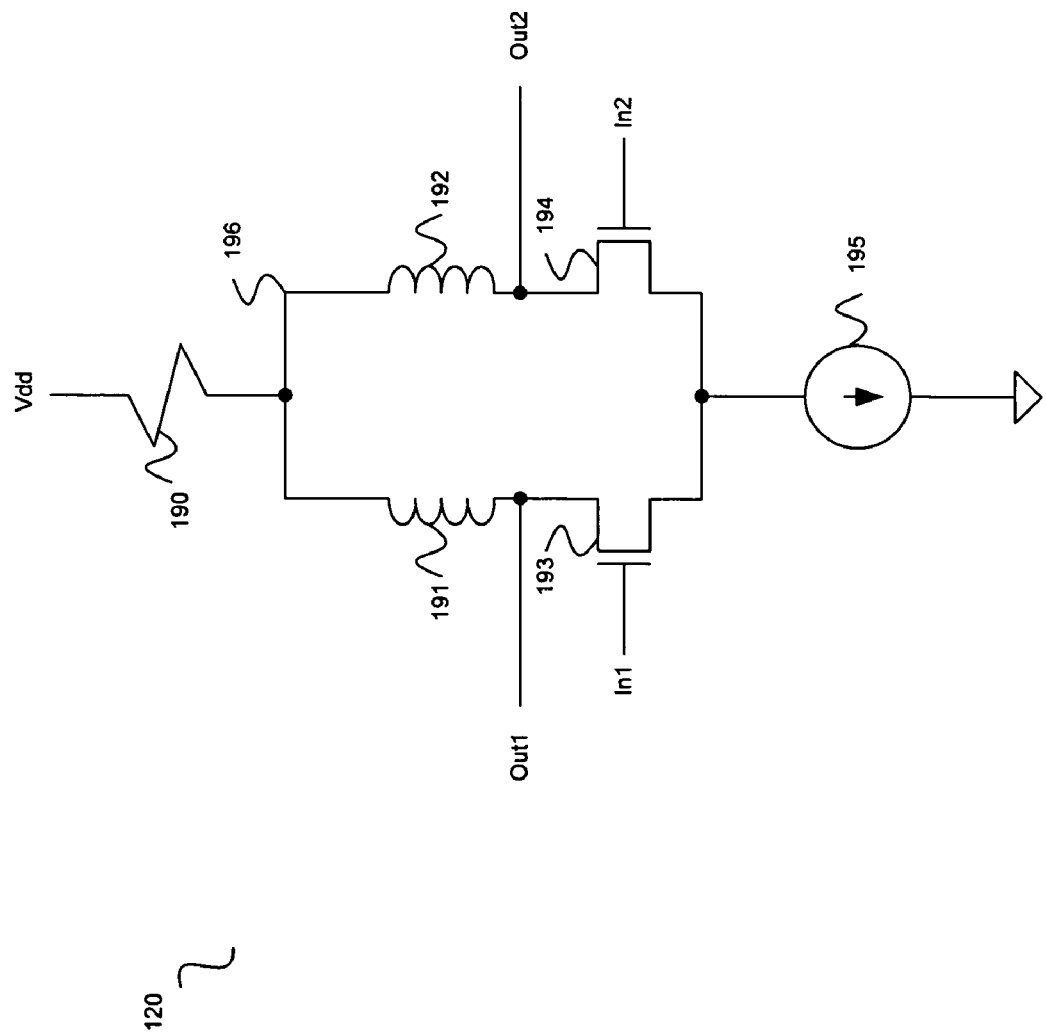
FIG. 1f is a block diagram of an exemplary RF buffer that utilizes common mode resistor to bias the complementary outputs, which may be utilized in connection with an embodiment of the invention.

FIG. 1f is a block diagram of an exemplary RF buffer that utilizes common mode resistor to bias the complementary outputs, which may be utilized in connection with an embodiment of the invention. Referring to FIG. 1f, there is shown a resistor 190, inductors 191 and 192, NMOS transistors 193 and 194 and a current source 195.

A first terminal of the resistor 190 may be coupled to a high voltage potential Vdd and a second terminal of the resistor 190 may be coupled to a first terminal of each of the inductors 191 and 192. A second terminal of each of the inductors 191 and 192 may be coupled to a drain of each of the NMOS transistors 193 and 194, respectively. The sources of the NMOS transistors 193 and 194 may be coupled to each other, and also to a first terminal of the current source 195. A second terminal of the current source 195 may be coupled to a low voltage potential, or ground. A gate of NMOS transistor 193 may receive one of the two complementary input signals In1, and the gate of the NMOS transistor 194 may receive the other of the two complementary input signals In2. The drain of the NMOS transistor 193 may provide one of the two complementary output signals Out1, and the drain of the NMOS transistor 194 may provide the other of the two complementary output signals Out2.

In operation, the complementary input signals In1 and In2 may allow currents to flow through the NMOS transistors 193 and 194, respectively. The input signals In1 and In2 may be amplified by the NMOS transistors 193 and 194, respectively, and communicated as the output signals Out1 and Out2, respectively. The resistor 190 may provide a voltage 196 where the voltage 196 may have the value V1, where V1=Vdd−(IxR). I may be the current from current source 195 and R may be the resistance value of the resistor 190. Therefore, the complementary output signals Out1 and Out2 at the drains of the NMOS transistors 193 and 194 may be biased at the desired V1 voltage level. The inductors 191 and 192 may resonate with their respective capacitive loads to create tuned circuits. The tuned circuits may result in saving power when driving the capacitive loads. Due to the nature of the complementary output signals Out1 and Out2, a common node where the inductor 191 may be coupled to the inductor 192 may be an AC ground for those signals, and the voltage 196 may not be affected by the complementary output signals Out1 and Out2.

There may be some drawbacks to this method for generating a bias voltage. First, the resistance value of the resistor 190 may vary due to varying process parameters when the chip is made. As the resistance value varies, the voltage 196 may vary, and this may not be desirable. Second, the current source 195 may be programmable in order to control the amplitude of the output signals Out1 and Out2. However, the varying current from the current source 195 may vary the voltage 196, thereby changing the bias voltage of the outputs signals Out1 and Out2, and this may not be desirable.

Figure 2:
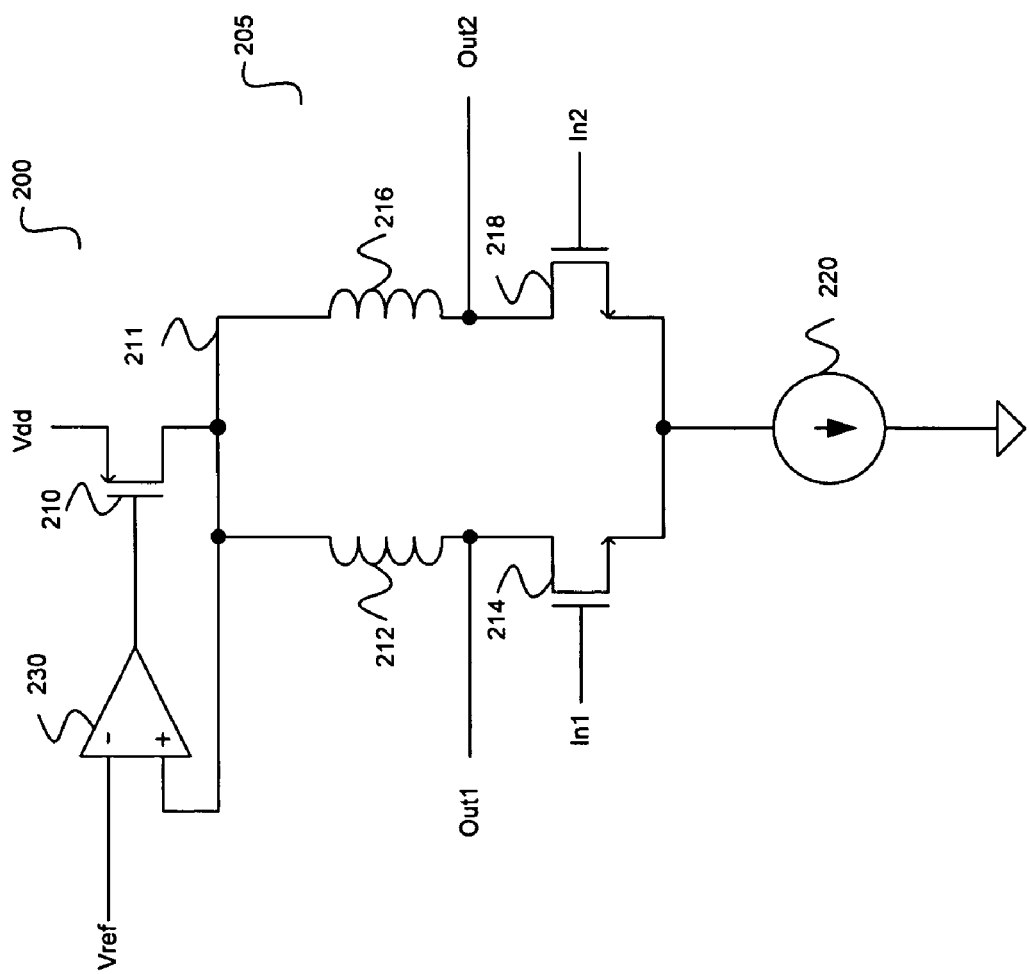
FIG. 2 is a block diagram illustrating a common mode feedback circuit in which high frequency output signals are not affected by the feedback circuit, in accordance with an embodiment of the invention.

FIG. 2 is a block diagram illustrating a common mode feedback circuit in which high frequency output signals are not affected by the feedback circuit, in accordance with an embodiment of the invention. Referring to FIG. 2, there is shown a feedback circuit 200, which may comprise a positive-channel metal oxide semiconductor (PMOS) transistor 210, an operational amplifier (op amp) 230, and a signal amplification circuitry 205, which may comprise a plurality of inductors 212 and 216, a plurality of NMOS transistors 214 and 218, and a current source 220.

The operational amplifier 230 may comprise suitable circuitry and/or logic that may be adapted to generate an output that may be an amplified difference of inputs to the operational amplifier 230. For example, the operational amplifier 230 may have a positive input terminal, a negative input terminal, and an output terminal. The negative input terminal may receive one of two input signals and the positive input terminal may receive the other of the two input signals. The signal at the negative input terminal may be subtracted from the signal at the positive input terminal and the resulting signal may be amplified and communicated to the output terminal of the operational amplifier 230.

For example, if the bias voltage 211 at the positive input terminal is lower than the Vref at the negative input terminal, the comparison of the voltages may be negative ((bias voltage 211)−Vref<0) since the reference voltage Vref is larger than the bias voltage 211. Therefore, the output voltage of the operational amplifier 230 may decrease, thereby allowing the PMOS transistor 210 to conduct more current, which may increase the bias voltage 211. Similarly, if the bias voltage 211 is greater than the reference voltage Vref, the comparison of the voltages may be positive ((bias voltage 211)−Vref>0) since the reference voltage Vref is smaller than the bias voltage 211. Therefore, the output voltage of the operational amplifier 230 may increase, thereby reducing the current flow of the PMOS transistor 210, which may decrease the bias voltage 211. When the bias voltage 211 is equal to the reference voltage Vref, the output voltage of the operational amplifier 230 may remain constant, and therefore, a steady state may be achieved.

The reference voltage Vref may be communicated to the negative input terminal of the operational amplifier 230, and the positive input terminal of the operational amplifier 230 may be coupled to the drain of the PMOS transistor 210. The voltage at the drain of the PMOS transistor may be referred to as the bias voltage 211. The source of the PMOS transistor 210 may be coupled to a high voltage potential, or Vdd, and the gate of the PMOS transistor may be coupled to the output terminal of the operational amplifier 230. The drain of the PMOS transistor 210 may be coupled to a terminal of each of the inductors 212 and 216. Another terminal of each of the inductors 212 and 216 may be coupled to a drain terminal of each of the NMOS transistors 214 and 218, respectively. Source terminals of the NMOS transistors 214 and 218 may be coupled to each other, and also to a terminal of the current source 220. Another terminal of the current source 220 may be coupled to a low voltage potential, or ground. A gate of NMOS transistor 214 may receive one of the two complementary input signals In1, and the gate of the NMOS transistor 218 may receive the other of the two complementary input signals In2. The drain of the NMOS transistor 214 may provide one of the two complementary output signals Out1, and the drain of the NMOS transistor 218 may provide the other of the two complementary output signals Out2.

In operation, the feedback circuit 200 may compare the bias voltage 211 to the reference voltage Vref, and adjust the output so as to keep the bias voltage 211 at the same voltage level as the reference voltage Vref. The complementary input signals In1 and In2 may allow currents to flow through the NMOS transistors 214 and 218, respectively. The input signals In1 and In2 may be amplified by the NMOS transistors 214 and 218, respectively, and communicated as the output signals Out1 and Out2, respectively. Due to the nature of the complementary output signals Out1 and Out2, a common node at the drain of the PMOS transistor 210 may be an AC ground for those signals, and the bias voltage 211 may not be affected by those signals.

Each of the inductors 212 and 216 may resonate with a capacitive load and create a tuned circuit, which may result in saving power when driving the respective capacitive load. The complementary output signals Out1 and Out2 may not affect the bias voltage 211 since the node where the inductors 212 and 216 are connected together may be an AC ground to these signals. Accordingly, the signals Out1 and Out2 at the drains of the NMOS transistors 214 and 218 may be biased at the bias voltage 211.

The feedback circuit 200 may be adapted to keep the bias voltage 211 at the desired reference voltage Vref regardless of the current in the current source 220, or process variations that may occur during chip manufacture. Hence, the bias voltage 211 may bias output signals Out1 and Out2, and this bias voltage 211 may be independent of the current source 220. In addition, the bias voltage 211 may be changed by changing the reference voltage Vref. Also, the chip space utilized by the feedback circuit 200 may be less than the additional resistors and/or capacitors used in FIGS. 1e and 1f. A further advantage may be that in the common mode feedback circuit illustrated in FIG. 2, in accordance with an embodiment of the invention, high frequencies that may comprise the complementary output signals Out1 and Out2 may not be affected by the feedback circuit 200. This may be because the feedback circuit 200 may not be in the high frequency signal path, but, rather, at a DC section of an RF buffer where the common node of the inductors may be AC ground.

Figure 3:
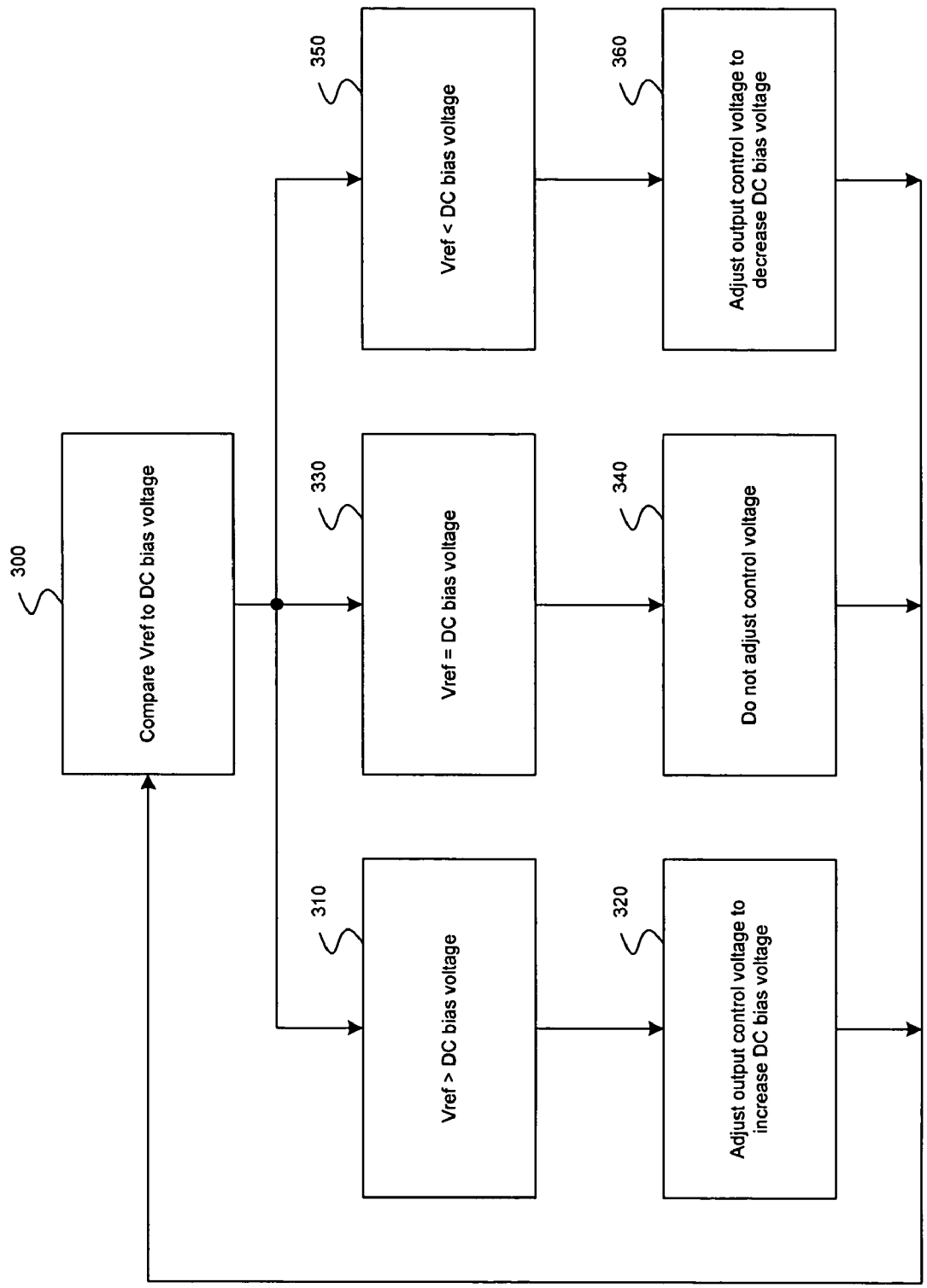
FIG. 3 is an exemplary flow diagram illustrating utilization of common mode feedback for generating a DC bias voltage, in accordance with an embodiment of the invention.

FIG. 3 is an exemplary flow diagram illustrating utilization of common mode feedback for generating a DC bias voltage, in accordance with an embodiment of the invention. Referring to FIG. 3, in step 300, a differential amplifier, for example, an operational amplifier, may compare an input reference voltage Vref to another input, which may be a feedback signal, for example, a DC bias voltage which may be desired to be at the reference voltage Vref.

In step 310, if the differential amplifier detects that the reference voltage Vref is greater than the DC bias voltage, then the control voltage, which may be an output of the differential amplifier, may be adjusted to increase the DC bias voltage. The DC bias voltage may be an output of a transistor, and the control voltage may control the current flow through the transistor. Accordingly, the control voltage may control the output voltage of the transistor. In step 320, the control voltage may be utilized by the transistor to increase the DC bias voltage. In step 330, if the operational amplifier detects that the Vref is the same voltage as the DC bias voltage, the control voltage may not change in step 340. Therefore, the DC bias voltage may remain constant. Finally, if, in step 350, the operational amplifier detects that the reference voltage Vref is less than the DC bias voltage, then the control voltage may be adjusted to decrease the DC bias voltage. Therefore, in step 360, the control voltage may be utilized by the transistor to decrease the DC bias voltage accordingly.

Although an embodiment of the invention may have been described in FIG. 2 and FIG. 3 using an operational amplifier 211 and a reference voltage Vref, the invention may not be so limited. For example, other differential amplifiers may be used in place of the operational amplifier 211. Also, the feedback circuitry may comprise other devices and/or configurations. For example, the reference voltage Vref may be communicated to the positive input terminal of the operational amplifier, the bias voltage 211 may be applied to the negative input terminal, and the PMOS transistor 210 may be replaced by an NMOS transistor. Additionally, various components may be used in the feedback loop to modify the bias voltage 211 or the reference voltage Vref, or other types of feedback configurations may be used.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

For a high frequency buffer using a common mode feedback loop, high frequency output paths may be coupled to a low frequency feedback path using a pair of inductors. The common mode feedback loop may be utilized to adjust an output DC level and may comprise a first differential amplifier and a first transistor. An output of the first differential amplifier may be coupled to an input of the first transistor, and the low frequency feedback path may communicate the output DC level from an output of the first transistor to a first input of the first differential amplifier. A reference voltage may be communicated to a second input of the first differential amplifier, and this reference voltage may be variable. The first differential amplifier may be adapted to compare the inputs and generate a control voltage, which may be utilized to adjust the output DC level.

What is claimed is:

1. A method for implementing a buffer circuit, the method comprising:

isolating a first high frequency differential output path and a second high frequency differential output path from a low frequency feedback path for a high frequency buffer using a common mode feedback loop, wherein a first terminal of a first inductor is directly connected to a first terminal of a second inductor and to said low frequency feedback path, a second terminal of said first inductor is directly connected to said first high frequency differential output path, and a second terminal of said second inductor is directly connected to said second high frequency differential output path; and adjusting an output DC level via said common mode feedback loop.

2. The method according to claim 1, further comprising utilizing a first differential amplifier in said common mode feedback loop.

3. The method according to claim 2, further comprising communicating said output DC level to a first input of said first differential amplifier via said low frequency feedback path.

4. The method according to claim 3, further comprising communicating a reference voltage to a second input of said first differential amplifier.

5. The method according to claim 4, further comprising varying said reference voltage.

6. The method according to claim 4, further comprising generating a control voltage at an output of said first differential amplifier.

7. The method according to claim 6, further comprising adjusting said output DC level via said control voltage, wherein said output DC level is an output of a first transistor.

8. The method according to claim 1, further comprising generating high frequency differential signals on said first high frequency differential output path and said second high frequency differential output path utilizing a second differential amplifier.

9. The method according to claim 8, further comprising coupling a second transistor to a third transistor in said second differential amplifier.

10. The method according to claim 8, further comprising generating said high frequency differential signals by said second differential amplifier utilizing current from a current source.

11. The method according to claim 10, further comprising varying said current in said current source.

12. A system for implementing a buffer circuit, the system comprising a high frequency buffer using a common mode feedback loop where a first high frequency differential output path and a second high frequency differential output path are isolated from a low frequency feedback path, wherein a first terminal of a first inductor is directly connected to a first terminal of a second inductor and to said low frequency feedback path, a second terminal of said first inductor is directly connected to said first high frequency differential output path, and a second terminal of said second inductor is directly connected to said second high frequency differential output path, and wherein said common mode feedback loop adjusts an output DC level.

13. The system according to claim 12, further comprising a first differential amplifier in said common mode feedback loop.

14. The system according to claim 13, further comprising a first input of said first differential amplifier, wherein said output DC level is communicated via said low frequency feedback path to said first input of said first differential amplifier.

15. The system according to claim 14, further comprising a reference voltage that is communicated to a second input of said first differential amplifier.

16. The system according to claim 15, wherein said reference voltage is variable.

17. The system according to claim 15, further comprising a control voltage generated at an output of said first differential amplifier.

18. The system according to claim 17, further comprising a first transistor, wherein said control voltage adjusts said output DC level, which is an output of said first transistor.

19. The system according to claim 12, further comprising a second differential amplifier generating high frequency differential signals on said first high frequency differential output path and said second high frequency differential output path.

20. The system according to claim 19, further comprising a second transistor coupled to a third transistor in said second differential amplifier.

21. The system according to claim 19, further comprising a current source providing current for use in generation of said high frequency differential signals by said second differential amplifier.

22. The system according to claim 21, wherein said current in said current source is variable.

* * * * *